(12) United States Patent
Kim et al.

(10) Patent No.: US 7,193,823 B2
(45) Date of Patent: Mar. 20, 2007

(54) MAGNETORESISTIVE DEVICE EXHIBITING SMALL AND STABLE BIAS FIELDS INDEPENDENT OF DEVICE SIZE VARIATION

(75) Inventors: Young Keun Kim, Seoul (KR); Jeong-Suk Park, Seoul (KR); Seong-Rae Lee, Seoul (KR)

(73) Assignee: Korea University Foundation (KR)

( * ) Notice: Subject to any disclaimer, the term of this patent is extended or adjusted under 35 U.S.C. 154(b) by 339 days.

(21) Appl. No.: 10/452,867

(22) Filed: Jun. 2, 2003

(65) Prior Publication Data

US 2004/0212933 A1 Oct. 28, 2004

(30) Foreign Application Priority Data

Apr. 25, 2003 (KR) ............ 10-2003-0026256

(51) Int. Cl.
G11B 5/39 (2006.01)
G11C 11/15 (2006.01)
(52) U.S. Cl. ............ 360/324.11; 365/158; 365/171; 365/173
(58) Field of Classification Search .......... 360/324.11, 360/324.12, 324.2; 257/421, 444; 365/158, 365/171, 173
See application file for complete search history.

(56) References Cited

U.S. PATENT DOCUMENTS

| 4,962,476 | A | 10/1990 | Kawada | 365/53 |
|---|---|---|---|---|
| 5,701,223 | A | 12/1997 | Fontana, Jr. et al. | 360/113 |
| 6,219,209 | B1 * | 4/2001 | Gill | 360/324.11 |
| 6,473,275 | B1 * | 10/2002 | Gill | 360/314 |
| 6,621,665 | B1 * | 9/2003 | Gill | 360/324.11 |
| 6,885,073 | B2 * | 4/2005 | Drewes | 257/421 |
| 2002/0097538 | A1 | 7/2002 | Seyama et al. | 360/324.11 |
| 2003/0057461 | A1 * | 3/2003 | Tran et al. | 257/295 |
| 2003/0137868 | A1 * | 7/2003 | Tran et al. | 365/145 |
| 2004/0008450 | A1 * | 1/2004 | Gill | 360/314 |
| 2005/0002131 | A1 * | 1/2005 | Gill | 360/324.12 |

OTHER PUBLICATIONS

European Search Report dated Nov. 4, 2005 (3 pgs).
Jeong-Suk Park et al: "Analysis on giant magnetoresistive characteristics of synthetic antiferromagnet-based spin-valves with modified pinned layers," IEEE, dated Mar. 28, 2003, pp. DQ-07.

* cited by examiner

Primary Examiner—William J Klimowicz
(74) Attorney, Agent, or Firm—Grossman, Tucker, Perreault & Pfleger, PLLC

(57) ABSTRACT

The present invention relates generally to the magnetic information storage technology, and particularly, to magnetic recording disc drives including a sensor having a giant magnetoresistance (GMR) based spin valve structure or a tunneling magnetoresistance(TMR) based tunnel junction magnetoresistance structure or magnetic random access memory device including a magnetic memory element(corresponding to a capacitor of DRAM) having a giant magnetoresistance (GMR) based spin valve structure or a tunneling magnetoresistance(TMR) based tunnel junction magnetoresistance structure. More particularly, the present invention relates to a spin valve magnetoresistive structure employed in the sensor of magnetic recording disc drive or tunnel junction magnetoresistive structure employed in the magnetic storage element of magnetic random access memory device.

15 Claims, 7 Drawing Sheets

MAGNETORESISTIVE DEVICE EXHIBITING SMALL AND STABLE BIAS FIELDS INDEPENDENT OF DEVICE SIZE VARIATION

PRIORITY

This application claims priority under 35 U.S.C. §119 to an application entitled "MAGNETORESISTIVE DEVICE EXHIBITING SMALL AND STABLE BIAS FIELDS INDEPENDENT OF DEVICE SIZE VARIATION" filed in the Korean Intellectual Property Office on Apr. 25, 2003 and assigned Ser. No. 2003-26256, the contents of which are incorporated herein by reference.

BACKGROUND OF THE INVENTION

1. Field of the Invention

The present invention relates generally to the magnetic information storage technology, and particularly, to magnetic recording disc drives including a sensor having a giant magnetoresistance (GMR) based spin valve structure or a tunneling magnetoresistance(TMR) based magnetic tunnel junction structure or magnetic random access memory device including a magnetic memory element(corresponding to a capacitor of DRAM) having a giant magnetoresistance (GMR) based spin valve structure or a tunneling magnetoresistance(TMR) based magnetic tunnel junction structure.

More particularly, the present invention relates to a spin valve magnetoresistive structure employed in the sensor of magnetic recording disc drive or tunnel junction magnetoresistive structure employed in the magnetic memory element of magnetic random access memory device.

2. Description of the Related Art

Spin-valve (SV) multilayers possessing giant magnetoresistance (GMR) are widely used in magnetic recording disc drives and are also considered for magnetic random access memory (MRAM) devices for high density data storage.

The magnetostatic field (Hms) generated from pinned layer of the SV multilayers should be reduced in order to improve the bias point (BP) and the sensitivity of SV. This becomes more prominent when the unit cell size becomes smaller because the contribution of the magnetostatic interactions to the total energy increases with a decrease of the cell size. To solve this problem, Fujitsu and Seagate used the bias compensation layer adjacent to free and pinned layer, respectively, and IBM used the synthetic antiferromagnet-based spin-valves (SSV) to reduce the net moment of the pinned layer.

A magnetic bias point control is of practical importance for operating magnetic recording disc drives and magnetic random access memory devices. The magnetic bias point is defined as an offset of the central position of the magnetoresistive transfer curve with respect to the zero field. The magnetoresistive transfer curve is usually linear for magnetic recording disc drives and square-shaped for magnetic random access memory applications.

FIG. 1 shows a conventional synthetic antiferromagnet-based spin-valves(SSV) structure. In this regard, U.S. Pat. No. 5,701,223 discloses a inverted spin valve magnetoresistive sensor which is used in magnetic recording disc drive.

A free layer is separated from a synthetic antiferromagnetic structure(pinned layer) by a nonmagnetic, electrically-conducting spacer layer (e.g. Cu) in FIG. 1. The magnetization of the synthetic antiferromagnetic structure is fixed by an antiferromagnetic layer(AFM layer). The synthetic antiferromagnetic structure(pinned layer) comprises a first ferromagnetic layer (P1) and a second ferromagnetic layer (P2) separated by an antiparallel coupling layer (APC) of nonmagnetic material. Typical material used as P1 (or P2) is CoFe and typical material used as APC is Ru. The two ferromagnetic layers in the synthetic antiferromagnetic structure(pinned layer) have their magnetization directions oriented antiparallel. The free layer is formed on a seed layer deposited on the substrate. To complete the spin valve(SV) magnetoresistive structure, a capping layer is formed on the AFM layer. Typical material used as a seed layer is NiFe, Cu or Ru. In particular, SSV with CoFe (P2)/Ru/CoFe (P1) trilayer pinning schemes possesses the advantages of improved thermal and magnetoresistive properties.

They, however, have still suffered from poor switching asymmetry at submicrometer cell size due to the thickness difference between P2 and P1 layers. Also, as cell size decreased, the bias point in the SSV increased exponentially due to a magnetostatic field from the CoFe layer.

Moreover, the effective exchange field is needed much larger than that of the SSV. The shape of magnetoresistive transfer cures is needed to be maintained in spite of the device size variation.

SUMMARY OF THE INVENTION

Accordingly, it is an object of the present invention to provide a modified synthetic antiferromagnet-based spin-valve (MSSV) magnetoresistive structure in which good bias point control is attained and, in particular, attained at unit cell dimensions in submicrometer level.

It is another object of the present invention to provide a modified synthetic antiferromagnet-based spin-valve (MSSV) magnetoresistive structure in which bias point is maintained constant independent of cell size variation.

It is a further object of the present invention to provide a modified synthetic antiferromagnet-based spin-valve (MSSV) magnetoresistive structure in which the effective exchange field is much larger than that of SSV.

It is a further object of the present invention to provide a modified synthetic antiferromagnet-based spin-valve (MSSV) magnetoresistive structure in which the shape of magnetoresistive transfer cures is maintained in spite of the cell size variation.

To achieve those above objects, the present invention proposes a modified synthetic antiferromagnet-based spin-valves(MSSV) magnetoresistive structure including a modified pinning structure incorporating an additional ferromagnetic layer (P3)/antiparallel coupling layer(APC) bilayer. Therefore, the present invention has a pinned layer including a CoFe(P1)/Ru/CoFe(P2)/Ru/CoFe(P3) instead of CoFe (P1)/Ru/CoFe(P2) of SSV magnetoresistive structure.

The structure of MSSV comprises NiFe(3.2 nm)/CoFe (1.6 nm)/Cu(2.8)/CoFe(P3,1.5 nm)/Ru(0.7 nm)/CoFe(P2, 3.0 nm)/Ru(0.7 nm)/CoFe(P1,1.5 nm)/IrMn(9.0 nm) and SSV comprises the same as MSSV except for CoFe(P3,1.5 nm)/Ru(0.7 nm)bilayer. Thst is, the structure of the MSSV according to the preferred embodiment of the present invention includes a free layer (e.g. NiFe/CoFe bilayer) separated from a pinned layer (synthetic antiferromagnetic structure) by a nonmagnetic, electrically-conducting spacer layer (Cu) and antiferromagnetic layer(IrMn) formed on the pinned layer. The magnetization of the pinned layer (synthetic antiferromagnetic structure) is fixed by an antiferromagnetic (AFM) layer. The pinned layer (synthetic antiferromagnetic structure) comprises a first ferromagnetic layer (P1) and a second ferromagnetic layer (P2) separated by first antiparallel coupling layer (APC) of nonmagnetic material, and additional third ferromagnetic layer (P3) and the second ferromagnetic layer (P2) separated by a second antiparallel coupling layer (APC) of nonmagnetic material. Typical material used as P1(or P2 or P3) is CoFe and typical material used as APC is Ru, respectively. The three ferromagnetic layers in the pinned layer(synthetic antiferromagnetic structure) have their magnetization directions oriented antiparallel. The free layer is formed on a seed layer deposited on the substrate. And a capping layer is formed on the antiferromagnetic(AFM) layer.

In MSSV, P3 layer is expected to play a role of compensating the net Hms from P1 and P2 layers.

The intention of MSSV is to compensate the net moment between P1 and P2 layers by an additional P3 layer. Since P3 layer is probably also AF exchange-coupled with P2 layer, the magnetization direction of P3 layer points in opposite direction compared with that of P2 layer, hence, the net moment direction. Therefore, the magnetization of P3 layer could compensate the net moment if the thickness of P3 layer which is similar to the thickness difference of 1.5 nm is chosen adequately.

In tunnel junction magnetoresistive structure, $Al_2O_3$ is employed as a spacer layer instead of Cu.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention.

In the drawings.

DETAILED DESCRIPTION OF THE INVENTION

Reference will now be made in detail to the preferred embodiments of the present invention, examples of which are illustrated in the accompanying drawings.

Figure 1:
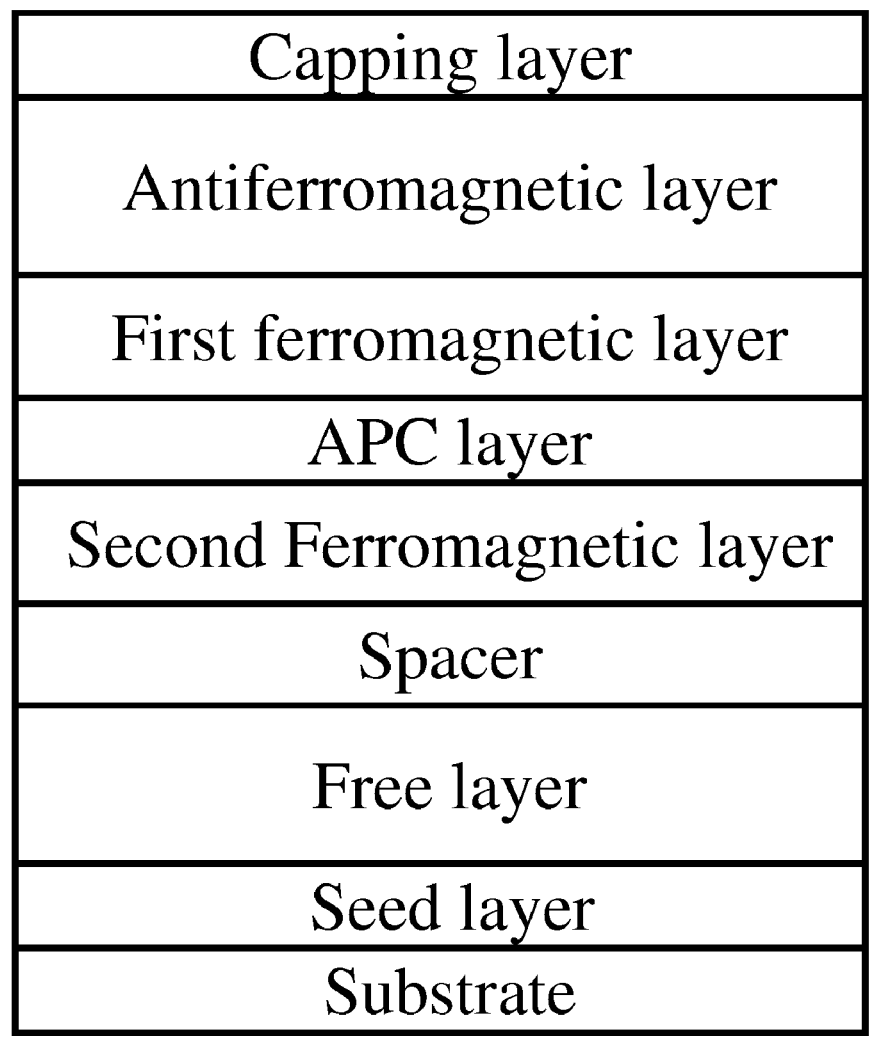
FIG. 1 is a schematic view, not to scale, of a conventional synthetic antiferromagnet-based spin-valves(SSV) structure.

FIG. 1 is a schematic view, not to scale, of a conventional synthetic antiferromagnet-based spin-valves(SSV) structure.

A free layer is separated from a synthetic antiferromagnetic structure(pinned layer) by a nonmagnetic, electrically-conducting spacer layer (e.g. Cu) in FIG. 1. The magnetization of the synthetic antiferromagnetic structure is fixed by an antiferromagnetic layer(AFM layer). The synthetic antiferromagnetic structure(pinned layer) comprises a first ferromagnetic layer (P1) and a second ferromagnetic layer (P2) separated by an antiparallel coupling layer (APC) of nonmagnetic material. Typical material used as P1 (or P2) is CoFe and typical material used as APC is Ru. The two ferromagnetic layers in the synthetic antiferromagnetic structure(pinned layer) have their magnetization directions oriented antiparallel. The free layer is formed on a seed layer deposited on the substrate. To complete the spin valve (SV) magnetoresistive structure, a capping layer is formed on the AFM layer. Typical material used as a seed layer is NiFe, Cu or Ru. As described above, this structure employing trilayer pinning schemes possesses the advantages of improved thermal and magnetoresistive properties. This structure, however, is prone to poor switching asymmetry at submicrometer cell size due to the thickness difference between P2 and P1 layers.

Figure 2:
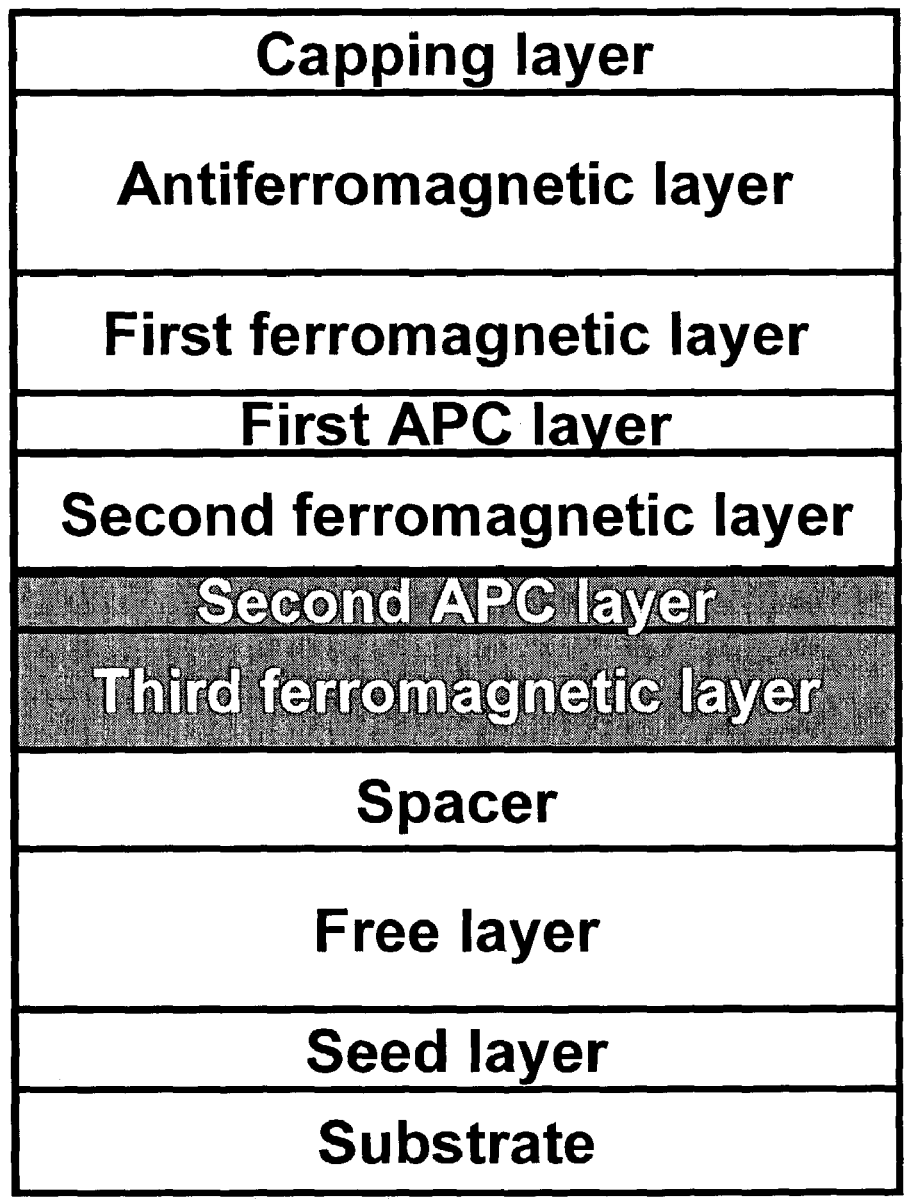
FIG. 2 is a schematic view, not to scale, of a modified synthetic antiferromagnet-based spin-valves (MSSV) structure according to the present invention.

FIG. 2 is a schematic view, not to scale, of a modified synthetic antiferromagnet-based spin-valves (MSSV) structure according to the preferred embodiment of the present invention. The structure of MS SV comprises NiFe(3.2 nm)/CoFe(1.6 nm)/Cu(2.8 nm)/CoFe(P3,1.5 nm)/Ru(0.7 nm)/CoFe(P2,3.0 nm)/Ru(0.7 nm)/CoFe (P1,1.5 nm)/IrMn (9.0 nm). MSSV has a same structure as SSV except that MSSV employs the pinned layer comprising CoFe(P3,1.5 nm)/Ru(0.7 nm)/CoFe(P2,3.0 nm)/Ru(0.7 nm)/CoFe(P1,1.5 nm) instead of CoFe(P2,3.0 nm)/Ru(0.7 nm)/CoFe(P1,1.5 nm) tri layer of SSV structure. That is, the structure of MSSV according to the preferred embodiment of the present invention includes a free Layer (e.g. NiFe/CoFe bilayer) separated from a pinned layer (synthetic antiferromagnetic structure) by a nonmagnetic, electrically-conducting spacer layer (Cu) and antiferromagnetic layer(IrMn) formed on the pinned layer. The magnetization of the pinned layer(synthetic antiferromagnetic structure) is fixed by an antiferromagnetic(AFM) layer. The pinned layer(synthetic antiferromagnetic structure) comprises a first ferromagnetic layer (P1) and a second ferromagnetic layer (P2) separated by first antiparallel coupling layer (APC) of no nmagnetic material, and additional third ferromagnetic layer (P3) and the second ferromagnetic layer (P2) separated by a second antiparallel coupling layer (APC) of no nmagnetic material. Typical material used as P1(or P2 or P3) is CoFe and typical material used as APC is Ru, respectively. The three ferromagnetic layers in the pinned layer(synthetic antiferromagnetic structure) have their magnetization directions oriented antiparallel. The free layer is formed on a seed layer deposited on the substrate. And a capping layer is formed on the antiferromagnetic(AFM) layer.

In MSSV, P3 layer is expected to play a role of compensating the net Hms from P1 and P2 layers.

The intention of MSSV is to compensate the net moment between P1 and P2 layers by an additional P3 layer. Since P3 layer is probably also AF exchange-coupled with P2 layer, the magnetization direction of P3 layer points in opposite direction with that of P2 layer, hence, the net moment direction. Therefore, the magnetization of P3 layer could compensate the net moment if the thickness of P3 layer which is similar to the thickness difference of 1.5 nm is chosen adequately.

A free layer (e.g. NiFe/CoFe bilayer) is separated from a synthetic antiferromagnetic structure by a nonmagnetic, electrically-conducting spacer layer (e.g. Cu). The magnetization of the synthetic antiferromagnetic structure is fixed by an AFM layer. The synthetic antiferromagnetic structure comprises a first ferromagnetic layer (P1) and a second ferromagnetic layer (P2) separated by first antiparallel coupling layer (APC) of nonmagnetic material, and additional third ferromagnetic layer (P3) and the second ferromagnetic layer (P2) separated by a second antiparallel coupling layer (APC) of no nmagnetic material Typical material used as P1 (or P2 or P3) and APC is CoFe and Ru, respectively. The three ferromagnetic layers in the synthetic antiferromagnetic structure have their magnetization directions oriented antiparallel. The free layer is formed on a seed layer deposited on the substrate. NiFe, Cu or Ru is used as a seed layer. To complete MSSV structure, a capping layer is deposited on the antiferromagnetic layer(here, Ta).

Here, the first antiparallel coupling layer is between and in contact with the first and second ferromagentic layers for coupling the first and second ferromagentic layers together antiferromagnetically so that their magnetizations are aligned antiparallel with one another, and the second antiparallel coupling layer is between and in contact with the second and third ferromagentic layers for coupling the second and third ferromagentic layers together antiferromagnetically so that their magnetizations are aligned antiparallel with one another.

The free layer has a preferred axis of magnetization in the absence of an applied magnetic field that is perpendicular to the magnetization axis of the first, second and third ferromagnetic layers in the pinned layers.

In forming an each thin film layer for MSSV structure, a sputtering method is used and typical base pressure was below $5 \times 10^{-8}$ Torr. Each layer was deposited with rates of 0.06~0.17 nm/s under 2~5 m Torr Ar pressure. An external magnetic field of 100 Oe was applied to the substrate plane during the film growth (i.e., growth field) so that magnetically oriented films were obtained. Postdeposition annealing was performed at 200~3000° C. for 10~300 mm in $10^{-6}$ Torr vacuum under 0.3~2 kOe fields.

If the growth field is applied in the positive field direction in SSV structure, the magnetization direction of thicker P2 layer points in positive direction and that of thinner P1 layer points in opposite (negative) direction because of the presence of a strong antiferromagnetic (AF) coupling between P1 and P2 layers. As the thickness of P2 layer is larger by 1.5 nm than that of P1 layer, the net moment due to the thickness difference of 1.5 nm may occur and point in positive direction. The Hms from this net moment would bias the switching point of the free layer and cause the switching asymmetry.

Thus, the intention of MSSV is to compensate the net moment between P1 and P2 layers by an additional P3 layer. Since P3 layer is probably also antiferromagnetic(AF) exchange-coupled with P2 layer, the magnetization direction of P3 layer points in opposite direction with that of P2 layer, hence, the net moment direction. Therefore, the magnetization of P3 layer could compensate the net moment if the thickness of P3 layer which is similar to the thickness difference of 1.5 nm is chosen adequately.

Figure 3:
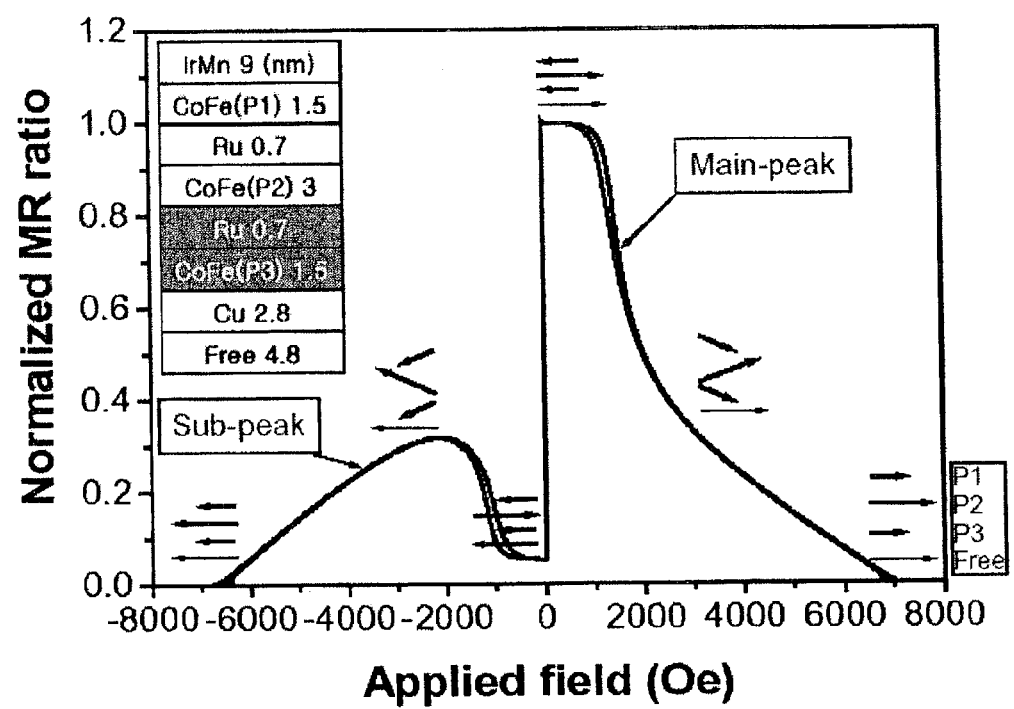
FIG. 3 shows a calculated normalized magnetoresistive (MR) transfer curve of modified synthetic antiferromagnet-based spin-valves (MSSV) structure according to the present invention.

FIG. 3 shows a calculated normalized magnetoresistive (MR) transfer curve of modified synthetic antiferromagnet-based spin-valves (MSSV) structure according to the present invention.

In order to better understand the magnetic configuration during the field cycle, the magnetization direction of each layer is illustrated with some important points on the transfer curve. MR transfer curve of MSSV shows both main-peak and sub-peak which are also observed in SSV. Two peaks, the main peak and the sub-peak, can be identified from the transfer curve. The main peak is related with the switching of the free layer while the much smaller sub-peak is related with the magnetization flop. It is expected that the MR transfer behaviors of MSSV are probably similar to those of SSV.

Figure 4:
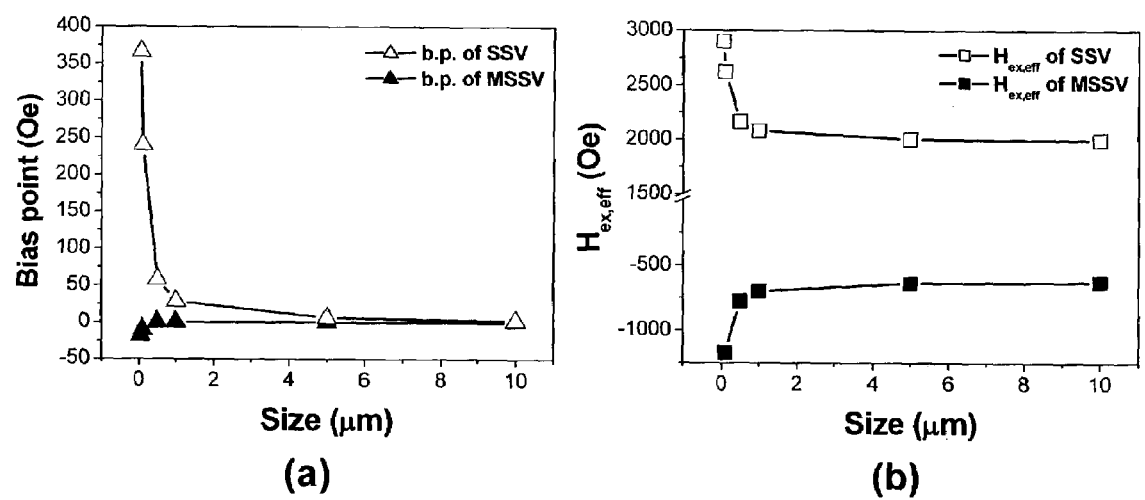
FIGS. 4(a) and (b) show bias point (BP) and Hex.eff variations as a function of unit cell size of a conventional synthetic antiferromagnet-based spin-valves (SSV) structure and a modified synthetic antiferromagnet-based spin-valves (MSSV) structure, respectively.

FIGS. 4(a) and (b) show bias point (BP) and effective exchange field(Hex.eff) variations as a function of unit cell size of a conventional synthetic antiferromagnet-based spin-valves (SSV) structure and a modified synthetic antiferromagnet-based spin-valves (MSSV) structure, respectively.

We defined BP and Hex,eff as the field where MR ratio was half of its zero field value. Bias point is defined as a distance between zero(0) field and medium point of sensing loop (MR ratio is 1/2 at this point) on MR transfer curve. Effective exchange field is defined as medium field of exchanged bias loop (MR ratio is 1/2 at this point) on MR transfer curve. Open triangles and closed ones indicate BP of SSV and MSSV, respectively. Open squares and closed ones correspond to Hex.eff of SSV and MSSV, respectively. As cell size decreased from 10 μm to 0.05 μm, BP of SSV increased exponentially from 2 to 366 Oe due to magnetostatic field(Hms) from net magnetic moment between P1 and P2 layers. On the contrary, BP of MSSV remained a nearly constant value of zero regardless of the reduction of the cell size. This result implies that the additional P3 layer compensates successfully Hms from the net moment and that good bias point control is obtained using P3 layer as a bias compensation layer. The absolute value of Hex.eff of both MSSV and SSV increased according to the decrease of the cell size. The reason is that the Hms from free layer at small cell dimension prevents the magnetization rotation of P3 (P2) layer in MSSV (SSV). At this point, it should be noted that the absolute value of Hex.eff of MSSV was much larger than that of SSV. At 0.05 μm×0.05 μm cell size, Hex.eff of SSV was 1382 Oe, while that of MSSV was 2897 Oe. In fact, high value of Hex.eff is regarded as one of the important advantages in SSV structure. In MSSV, however, higher value of Hex.eff than that of SSV was obtained, which means that the better thermal stability would be exhibited.

Figure 5:
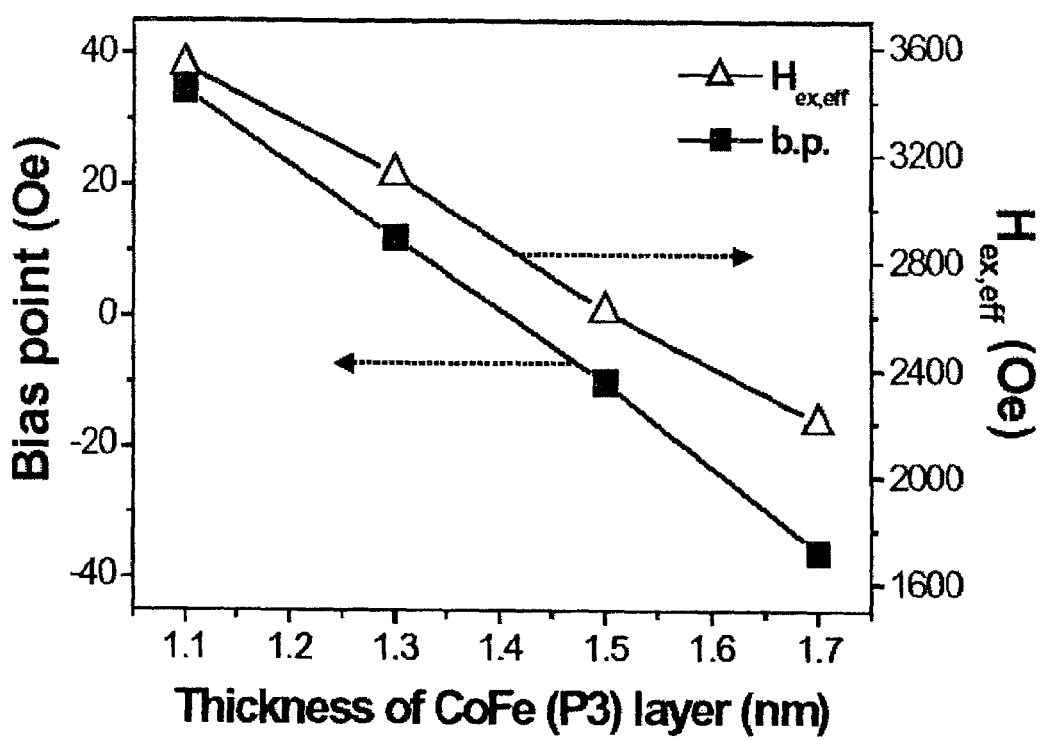
FIG. 5 shows bias point and Hex.eff variations as a function of the thickness of third CoFe layer (P3) of the pinned layer in MSSV at the size of 0.1 μm×0.1 μm cell.

FIG. 5 shows bias point and Hex.eff variations as a function of the thickness of third CoFe layer (P3) of the pinned layer in MSSV structure at the size of 0.1 μm×0.1 μm cell.

The effect of variation of thickness of P3 layer (tP3) on BP and Hex.eff of MSSV at 0.1×0.1 μm cell size is investigated. These results are shown in FIG. 5. Open triangles and closed squares indicate Hex.eff and BP of MSSV, respectively. At small tP3 (see tP3=1.1 nm), because tP3 is not thick enough to compensate the net moment, BP of free layer is shifted to positive field direction. As tP3 increased, BP of free layer moved to zero field. It was observed that BP of free layer was finally shifted to negative field direction at large tP3, where Hms of P3 layer excessed that of the net moment. These results indicate that the bias point can be further tuned by varying the P3 layer thickness. We also found the decrease of Hex.eff according to the increase of tP3. This is due to the reduction of AF coupling strength as the total thickness of P2 and P3 layers increases.

FIGS. 6(a) and 6(b) show normalized MR transfer curves at the field range between −1000 Oe and 1000 Oe in the case of a conventional synthetic antiferromagnet-based spin-valves (SSV) structure and a modified synthetic antiferromagnet-based spin-values (MSSV) structure with the size of 0.1 µm×0.1 µm cell, respectively.

Figure 6:
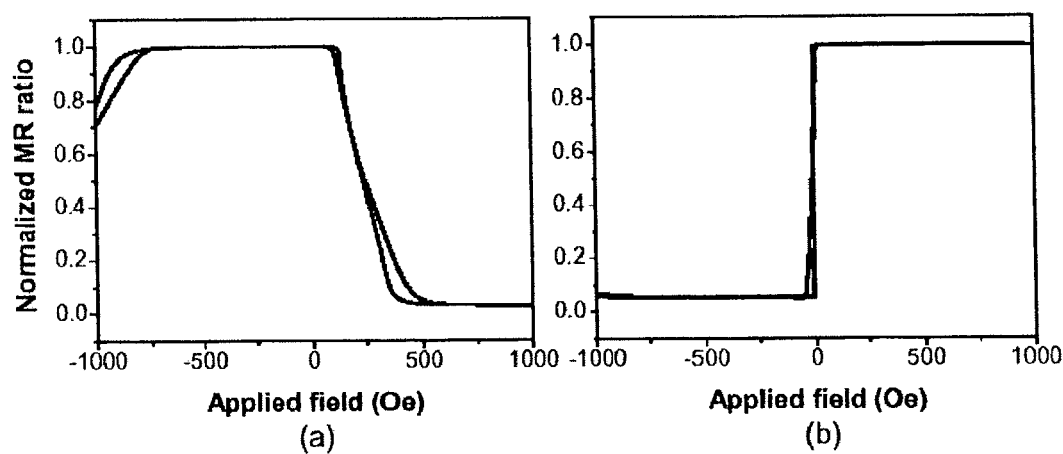
FIGS. 6(a) and 6(b) show normalized MR transfer curves at the field range between −1000 Oe and 1000 Oe in the case of a conventional synthetic antiferromagnet-based spin-valves (SSV) structure and a modified synthetic antiferromagnet-based spin-valves (MSSV) structure with the size of 0.1 μm×0.1 μm cell, respectively.

We compared MR transfer behavior of MSSV with that of SSV at 0.1×0.1 µm cell size. FIG. 6 shows the reduced normalized MR transfer curve at the field range between −1000 Oe and 1000 Oe. The BP shift of free layer in SSV is obviously observed in FIG. 6(a) while little BP shift in MSSV as shown in FIG. 6(b). Note that there is a difference of slope in MR transfer curve between SSV and MSSV near the zero field. The slope of SSV slants slightly while that of MSSV remains nearly orthogonal, which means that the magnetizaton of free layer in MSSV rotates more sharply.

FIGS. 7(a) and 7(b) show magnetization rotation angle of each magnetic layer versus applied field curves in the case of a conventional synthetic antiferromagnet-based spin-valves (SSV) structure and a modified synthetic antiferromagnet-based spin-valves (MSSV) structure with the size of 0.1 µm×0.1 µm cell, respectively.

Figure 7:
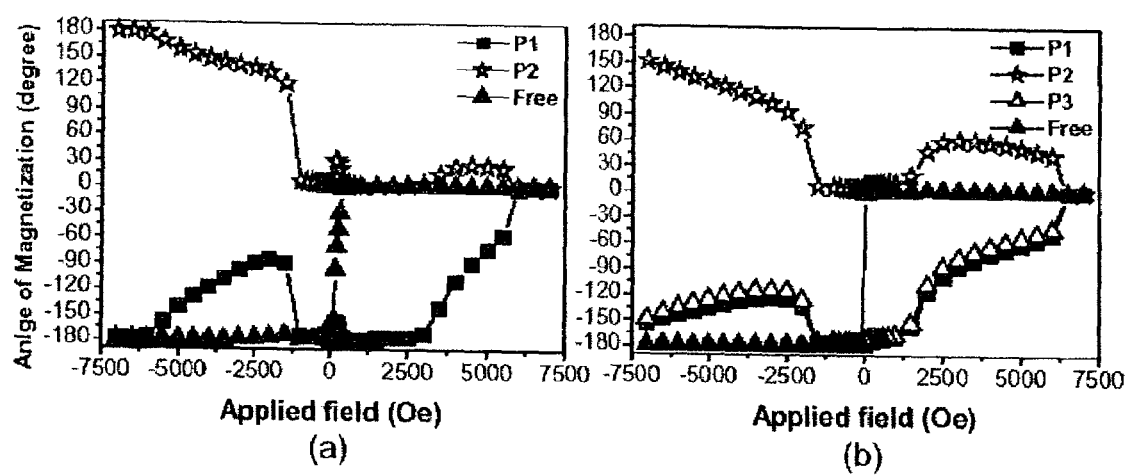
FIGS. 7(a) and 7(b) show magnetization rotation angle of each magnetic layer versus applied field curves in the case of a conventional synthetic antiferromagnet-based spin-valves (SSV) structure and a modified synthetic antiferromagnet-based spin-valves (MSSV) structure with the size of 0.1 μm×0.1 μm cell, respectively.

The variation of the magnetization rotation angle of each magnetic layer according to the reduction of the applied field from +7000 to −7000 Oe (not cycling between +7000 and −7000 Oe) is shown. In FIG. 7, Closed squares, open stars, open triangles, and closed triangles represent P1, P2, P3, and free layers, respectively.

In FIG. 7(a), we could find the small canting of magnetization in P2 layer due to the Hms from free layer when its magnetization started to rotate near zero field. In MSSV, however, this phenomenon was not shown in FIG. 7(b). The magnetization canting of P2 layer in SSV might decrease the strength of Hms from pinned layer on free layer. Thus, we think that the reduction of Hms due to the magnetization canting of pinned layer in SSV probably causes the slanting of slope in MR curve.

In addition, in accordance with the present invention, An enhancement of bias point control can be realized by modifying pinned layer structure by adding additional CoFe(P3)/Ru bilayer. This bilayer can compensate the net moment between P1 and P2 layers. This design, thus, offers robust bias point control capability irrelevant of device size variation. Larger effective exchange field and better thermal stability can also be accomplished which are needed for ultrahigh density data storage applications.

In tunnel junction magnetoresistive structure, $Al_2O_3$ is employed as a spacer layer instead of Cu. Tunnel junction magnetoresistive structure employing modified pinned layer including additional CoFe(P3)/Ru bilayer has also the same improved effect as in MSSV structure.

The MSSV structure can be employed in a spin valve magnetoresistive sensor of magnetic recording disc drive to sense the magnetically recorded data on magnetic recording disk described in U.S. Pat. No. 5,701,223. That is, a magnetic recording disk drive comprising a magnetic recording disc, a motor connected to the disk for rotating the disk, a carrier for supporting a spin valve magnetoresistive sensor and a providing a substrate for attachment of the sensor, the spin valve magnetoresistive sensor formed on the carrier substrate for sensing magnetically recorded data on the disk, the sensor including a modified synthetic antiferromagnet based spin valve structure according to the present invention, an actuator for moving the carrier, means connecting the carrier to the actuator, means electrically coupled to the sensor and means for supporting the motor and actuator.

The MSSV structure can be employed in a magnetic storage element of a dynamic random access memory(magnetic memory) devices. A unit cell of dynamic random access memory comprises of a field effect transistor and a capacitor. A transistor comprises a source region, a drain region spaced apart from the source region and a gate deposited on the region above between the source and the drain region formed on a semiconductor substrate. The capacitor is a storage element and is connected to one of the source and the drain regions. Th typical dynamic random access memory structure is shown in U.S. Pat. No. 4,962,476. A magnetic random access memory(magnetic memory) uses a magnetic storage elememt instead of the capacitor. The MSSV structure according to the present invention can be used as the magnetic storage element in the magnetic random access memory device.

Structure and operation according to the embodiment of the present invention as described above may be achieved. It will be apparent to those skilled in the art that various modifications and variations can be made in the present invention. Thus, it is intended that the present invention covers the modifications and variations of this invention, as defined by the scope of the appended claims and their equivalents.

What is claimed is:

1. A spin valve type magnetoresistive structure incorporating a free layer and a pinned ferromagnetic layer separated by a nonmagnetic spacer layer, wherein the improvement in combination comprises:
   a free layer;
   an electrically conductive spacer layer of a nonmagnetic material formed directly on and in contact with the free layer;
   only one pinned layer, said pinned layer comprising:
      a third ferromagnetic layer formed on the spacer layer;
      a second antiparallel coupling layer overlying the third ferromagnetic layer;
      a second ferromagnetic layer formed on the second antiparallel coupling layer;
      a first antiparallel coupling layer overlying the second ferromagnetic layer;
      a first ferromagnetic layer formed on the first antiparallel coupling layer;
      wherein a thickness of said third ferromagnetic layer is approximately equal to, or less than, a thickness of the first ferromagnetic layer, and a thickness of said second ferromagnetic layer is greater than the thickness of said first and said third ferromagnetic layers; and
   an antiferromagnetic layer overlying the first ferromagnetic layer.

2. A spin valve type magnetoresistive structure as in claim 1 wherein the first antiparallel coupling layer is between and in contact with the first and second ferromagentic layers for coupling the first and second ferromagentic layers together antiferromagnetically so that their magnetizations are aligned antiparallel with one another, and the second antiparallel coupling layer is between and in contact with the second and third ferromagentic layers for coupling the second and third ferromagentic layers together antiferromagnetically so that their magnetizations are aligned antiparallel with one another.

3. A spin valve type magnetoresistive structure as in claim 1 wherein a thickness of third ferromagnetic layer is similar with a thickness difference between the first and second ferromagnetic layer.

4. A spin valve type magnetoresistive structure as in claim 1 wherein a free layer has a preferred axis of magnetization in the absence of an applied magnetic field that is perpendicular to the magnetization axis of the first, second and third ferromagnetic layers in the pinned layers.

5. A spin valve type magnetoresistive structure as in claim 1 wherein the second and first antiparallel coupling layer consist of Ru.

6. A spin valve type magnetoresistive structure as in claim 1 wherein the dimension of the spin valve type magnetoresistive structure is substantially below 1 μm.

7. A spin valve type magnetoresistive structure as in claim 1 wherein the free layer consists of a CoFe layer and a NiFe layer.

8. A spin valve type magnetoresistive structure as in claim 1 wherein the antiferromagnetic layer consists of IrMn.

9. A spin valve type magnetoresistive structure as in claim 1 wherein the spacer layer consists of Cu.

10. A spin valve type magnetoresistive structure as in claim 1 wherein a capping layer is formed on the antiferromagnetic layer.

11. A spin valve type magnetoresistive structure as in claim 1 wherein said free layer is formed on a substrate and wherein a seed layer is formed on the substrate and below the free layer.

12. A inverted spin valve type magnetoresistive structure incorporating a free layer and a pinned ferromagnetic layer separated by a nonmagnetic spacer layer, wherein the improvement in combination comprises:

an antiferromagnetic layer;
only one pinned layer, said pinned layer comprising:
   a third ferromagnetic layer formed on the antiferromagnetic layer;
   a second antiparallel coupling layer overlying the third ferromagnetic layer;
   a second ferromagnetic layer formed on the second antiparallel coupling layer;
   a first antiparallel coupling layer overlying the second ferromagnetic layer;
   a first ferromagnetic layer formed on the first antiparallel coupling layer;
   wherein a thickness of said third ferromagnetic layer is approximately equal to, or less than, a thickness of said first ferromagnetic layer, and a thickness of said second ferromagnetic layer is greater than said thickness of said third or said first ferromagnetic layers;
an electrically conductive spacer layer of a nonmagnetic material formed directly on and in contact with the pinned layer;
a free layer overlying the spacer layer.

13. A inverted spin valve type magnetoresistive structure as in claim 12 wherein a thickness of third ferromagnetic layer is similar with a thickness difference between the first and second ferromagnetic layer.

14. A inverted spin valve type magnetoresistive structure as in claim 12 wherein a free layer has a preferred axis of magnetization in the absense of an applied magnetic field that is perpendicular to the magnetization axis of the first, second and third ferromagnetic layers in the pinned layers.

15. A inverted spin valve type magnetoresistive structure as in claim 12 wherein the antiparallel coupling layer consists of Ru.

* * * * *